United States Patent [19]

Zhang

[11] Patent Number: 5,771,245
[45] Date of Patent: Jun. 23, 1998

[54] PROCESS FOR INDEPENDENTLY PROTECTING TWO DIMENSIONAL CODES FROM ONE OR MORE BURST ERRORS PATTERNS

[75] Inventor: Xiao Bei Zhang, Foster City, Calif.

[73] Assignee: Xerox Corporation, Stamford, Conn.

[21] Appl. No.: 856,001

[22] Filed: Mar. 20, 1992

[51] Int. Cl.[6] .......................... H03M 13/00; G06F 11/00
[52] U.S. Cl. ...................... 371/39.1; 371/37.7; 371/37.4; 371/38.1; 371/2.1
[58] Field of Search ................................. 371/37.7, 37.4, 371/38.1, 39.1, 2.1

[56] References Cited

U.S. PATENT DOCUMENTS

| | | | |
|---|---|---|---|
| 4,375,101 | 2/1983 | Cerracchio | 371/69.1 |
| 4,646,301 | 2/1987 | Okamoto et al. | 371/37.4 |
| 4,653,052 | 3/1987 | Doiet et al. | 371/37.4 |
| 4,745,604 | 5/1988 | Patel et al. | 371/37.2 |
| 4,764,927 | 8/1988 | Izumita et al. | 371/38.1 |
| 4,868,824 | 9/1989 | Golden | 371/53 |
| 5,068,855 | 11/1991 | Kashida et al. | 371/37.4 |
| 5,091,966 | 2/1992 | Bloomberg et al. | 382/21 |
| 5,181,207 | 1/1993 | Chapman | 371/37.4 |
| 5,226,043 | 7/1993 | Pughe, Jr. et al. | 371/40.1 |

OTHER PUBLICATIONS

Franklin F. Kuo, "Computer Applications in Electrical Engineering Series," 1970, pp. 131–135, Prentice Hall.

*Primary Examiner*—Robert W. Beausoliel, Jr.
*Assistant Examiner*—P. Vales

[57] ABSTRACT

All error correction computations for correcting decode errors that corrupt a binary message that is encoded in a two dimensional code, such as a two dimensional self-clocking glyph code, are performed on byte aligned (or, more generally, symbol aligned) symbol sets that span the message but no other variables.

10 Claims, 12 Drawing Sheets

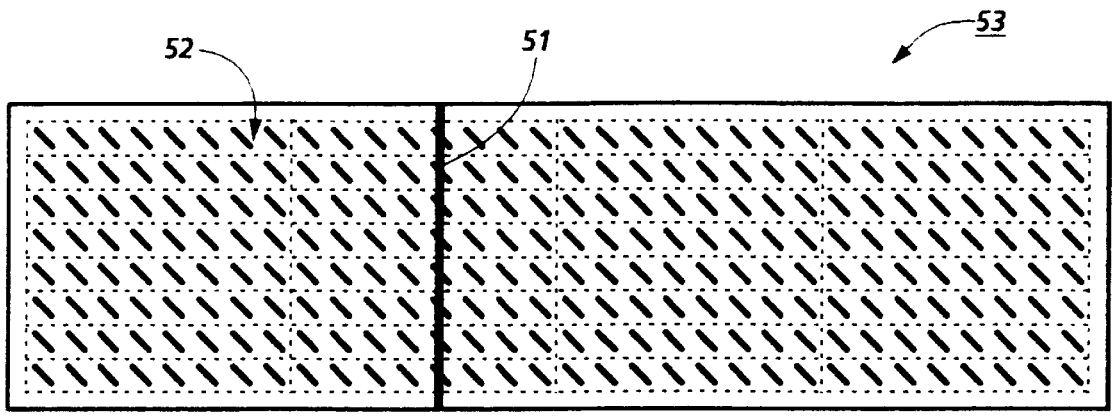
Fig. 3
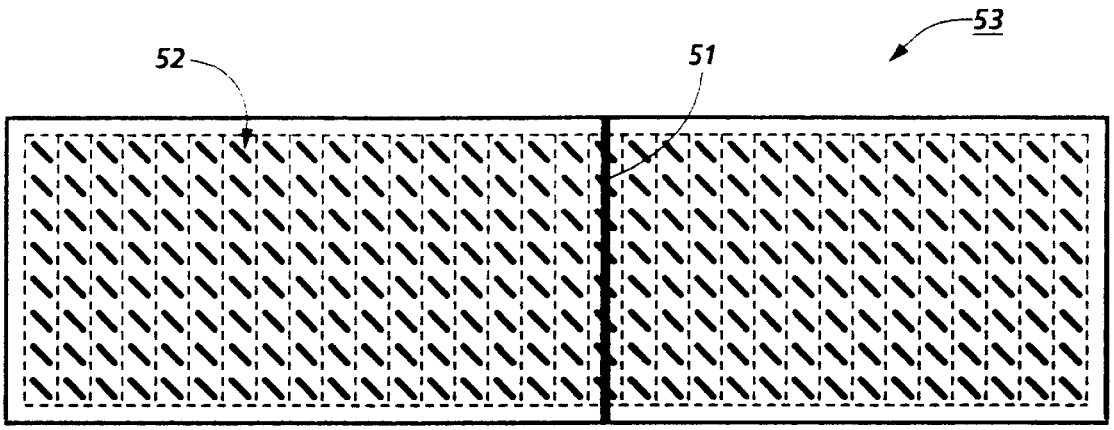
Fig. 4
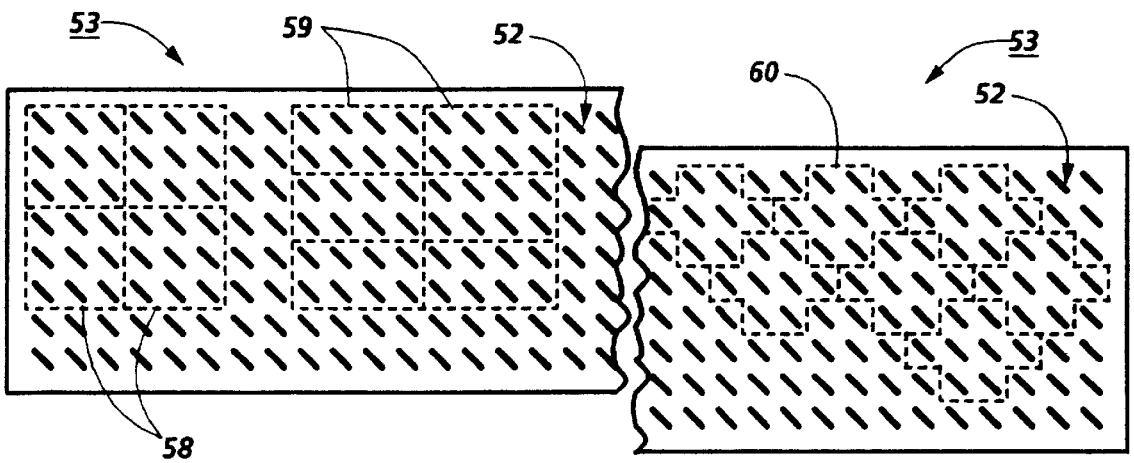
Fig. 5
Fig. 6

PROCESS FOR INDEPENDENTLY PROTECTING TWO DIMENSIONAL CODES FROM ONE OR MORE BURST ERRORS PATTERNS

FIELD OF THE INVENTION

This invention relates to glyph codes for transferring machine readable digital information back and forth between the electronic domain and the hardcopy domain. More specifically, this invention pertains to methods and means for reducing the "hard error" (i.e., uncorrectable error) susceptibility of self-clocking glyph codes.

BACKGROUND OF THE INVENTION

Self-clocking glyph codes have been developed for transferring machine readable information of various types (e.g., machine control instructions, data values, memory pointers, and even executable binaries) back and forth synchronously between the electronic domain and the hardcopy domain. Application engineering work still is being done, but it appears that these codes may prove to be a key technology for integrating hardcopy documents and computer controlled electronic document processing systems more or less seamlessly.

It has been shown that self-clocking glyph codes can be implemented for encoding one or more bits per glyph. See the copending and commonly assigned United States Patent Applications of: Dan S. Bloomberg et al., which was filed Jul. 31, 1990 under Ser. No. 07/560,514 on "Self-Clocking Glyph Codes" (D/89194); Xiao Bei Zhang, which was filed Dec. 27, 1991 under Ser. No. 07/814,841 on "Self-Clocking Glyph Codes for Encoding Dual Bit Digital Values Robustly" (D/91762); and David L. Hecht et al., which was filed Dec. 27, 1991 under Ser. No. 07/816,212 (now abandoned in favor of application Ser. No. 08/186,212) on "Self-Clocking Glyph Code Having Composite Glyphs for Distributively Encoding Multi-Bit Digital Values" (D/91764). A self-clocking glyph code faithfully preserves the logical ordering of the bits that are encoded in its glyphs because the glyphs are written onto and read from a suitable recording medium in a known order and in compliance with a predetermined spatial formatting rule. Furthermore, such a code also provides the sample clock that is needed for decoding it because every bit that is encoded by the code is explicitly represented by a glyph, either alone in the case of a single bit per glyph code or in combination with one or more additional bits in the case of a multiple bit per glyph code. Some multiple bit per glyph codes, such as the one described in the aforementioned Hecht et al. application, are suitable for encoding bits from multiple, independent bit streams.

Self-clocking glyph codes typically are composed of glyphs that are capable of being decoded reliably, even when they are significantly degraded. As a practical matter, however, glyph decoding errors still might occur because of the degradation of the glyphs that happens during the printing, replication, and/or communication of such glyph codes and during the handling of the recording media upon which those codes are written. For example, a glyph code might be degraded sufficiently to preclude reliable decoding of one or more of its glyphs by any one or more of the following factors: image noise that produces random or systematic patterns of black (i.e., ON) pixels in white regions of the code, and vice-versa; scanner noise that produces vertical (i.e., process direction) black streaks through the code, typically because of the presence of opaque material on the scan platen; transmission noise that produces horizontal lines of white (OFF) pixels in black regions of the code, and vice-versa; mechanical noise that distorts the code; and printer deficiencies that cause the printed image of the code to have broken lines and/or weak solid regions. The mishandling of the recording medium upon which such a code is written also can cause degradation of the image of the code, but the geometric characteristics of the glyph decoding errors that result from such mishandling are less predictable.

To reduce the frequency of the errors that occur during the decoding of self-clocking glyph codes, it would be desirable to minimize the number of code symbols that are corrupted by the burst error patterns that are most likely to occur. Even more specifically, it would be beneficial to have an efficient technique, which can be implemented by adding relatively little overhead to such codes, for protecting the data encoded in such codes against decode errors that are likely to be caused by any one or more of a plurality of anticipated burst error patterns.

SUMMARY OF THE INVENTION

Therefore, in accordance with this invention, all error correction computations for correcting decode errors that corrupt a binary message that is encoded in a two dimensional code, such as a two dimensional self-clocking glyph code, are performed on byte aligned (or, more generally, symbol aligned) symbol sets that span the message but no other variables.

BRIEF DESCRIPTION OF THE DRAWINGS

Still further features and advantage of this invention will become apparent when the following detailed description is read in conjunction with the attached drawings, in which

FIG. 3 is an enlarged view of a two dimensional glyph code that is degraded by a vertical burst error pattern FIG. 4 shows the code of FIG. 3 with its glyphs logically sorted into symbol strings that correlate with the vertical burst error pattern.

FIG. 5 illustrates a tiling pattern that is produced by sorting the bits that are encoded by a self-clocking glyph code into symbols that map into adjacent rectangular regions of the code;

FIG. 6 illustrates still another tiling pattern that can be produced;

FIG. 14 illustrates a generalization of the write and read processes shown in FIGS. 10 and 11, respectively; and FIGS. 15–18 illustrate further generalizations.

DETAILED DESCRIPTION OF THE ILLUSTRATED EMBODIMENT

While the invention is described in some detail hereinbelow with reference to an illustrated embodiment, it is to be understood that there is no intent to limit it to the embodiment. On the contrary, the aim is to cover all modifications, alternatives and equivalents falling within the spirit and scope of the invention as defined by the appended claims.

Figure 1:
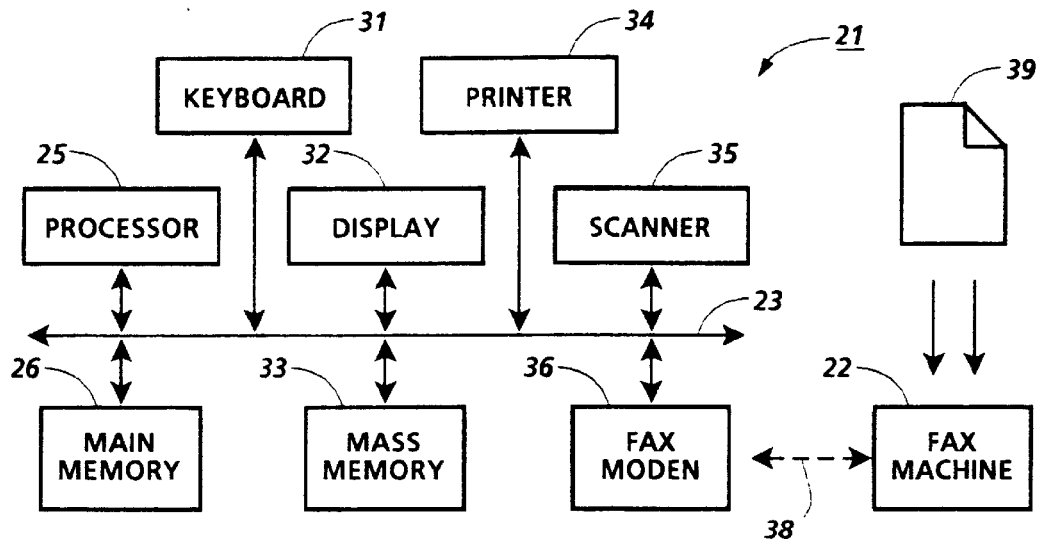
FIG. 1 is a functional block diagram of a host computer system in which the present invention may be employed to advantage.

Turning now to the drawings, and at this point especially to FIG. 1, there is a computer system 21 that is configured not only to provide all of the usual functionality of a standard personal computer, but also to function as a host server for facsimile communications to and from remote facsimile terminals, such as the fax machine 22. As shown, the computer 21 has a bus 23 for interfacing a processor 25 with a main memory 26 and various I/O devices, including a keyboard 31, a display 32, a mass memory 33, a printer 34, a scanner 35 and a fax modem 36. As will be appreciated, the processor 25 carries out the memory transactions and the I/O transactions that are required for performing its assigned tasks under program control. While the computer 21 is illustrated as having a bus architecture and a single processor 25, it will be evident that a variety of program controlled computer systems, including those that have different architectures and/or multiple processors, can be used to carry out this invention.

Figure 2:
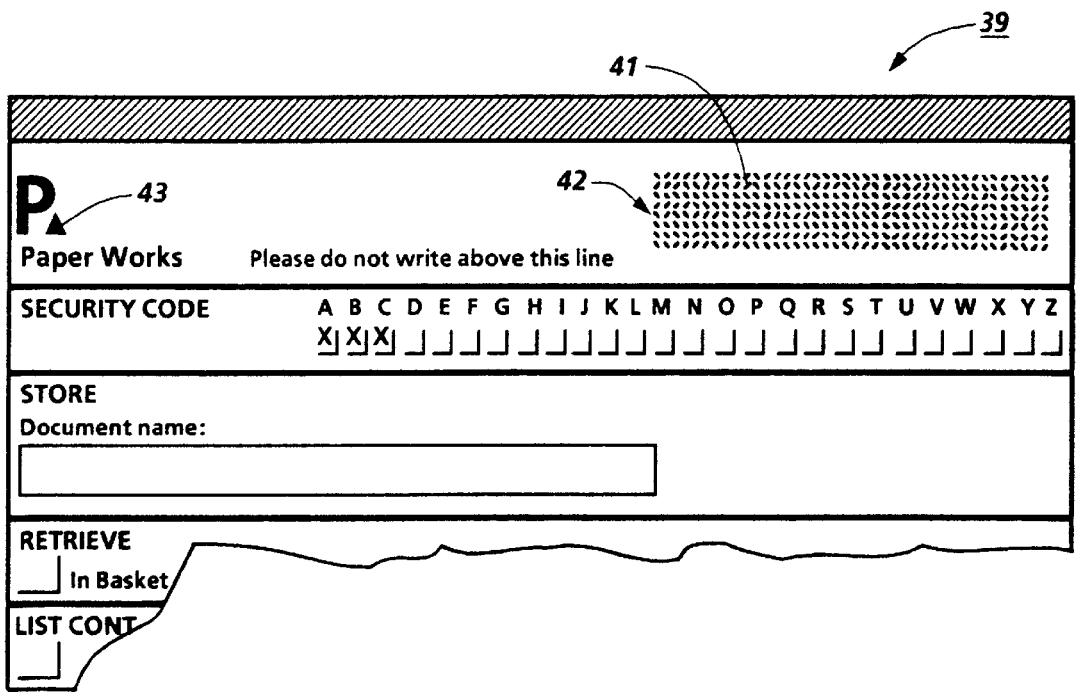
FIG. 2 is a fragmentary view of a form which is identified by the two dimensional self-clocking glyph code that is written thereon.

Facsimile communications to and from the computer system 21 are routed through the fax modem 36 and a suitable communications link 38 (shown in phantom line), such as the public switched telephone network. To give users of remote facsimile terminals, such as the terminal 22, easy access to the facsimile server functions of the computer system 21, users have access to a variety of predefined standard and/or customized forms, such as the form 39 that is shown in FIG. 2. Each of these forms is uniquely identified by a self-clocking glyph code 41 that is written on it in a two dimensional code field 42. In one implementation, the code field 42 is of predetermined size (1 byte high×5 bytes wide) and is spatially positioned on the form at a predetermined location with respect to a predefined reference point 43. That simplifies finding the code field 42 and reading its contents, but the coding of the forms could be implemented in a less structured way if desired. Indeed, the details of the user interface that is provided by these forms is beyond the scope of this invention, but it is to be understood that the identification of the forms and the interpretation of their content is dependent upon the ability of the computer system 21 to read the glyph codes that are carried by the forms that are faxed into it with sufficient accuracy to reliably discriminate among the different forms.

As will be appreciated, it is relatively easy to write essentially error-free glyph codes on forms that are generated locally by the computer system 21. Such forms typically are printed by the printer 34 under the control of a processor 25 from a form file that is stored by the mass memory 33. However, it is far more difficult to achieve essentially error free decoding of the glyph codes that are carried by forms that are faxed into the computer system 21 because those codes generally are degraded and/or distorted by various types of image and transmission noise.

For example, as shown in FIG. 3, there is a vertical or process direction burst error 51 that corrupts a glyph code 52. In this instance, the code 52 encodes a string of message bits that are organized in standard eight bit data bytes that map into the code field 53 in left-to-right, top-to-bottom order. For illustrative convenience, the graphical distinctions that enable the glyphs of the code 52 to effectively encode a binary message are not shown in this and some of the other drawings that are discussed hereinbelow, but it will be understood that the glyphs suitably are tilted at angles of approximately +45° and −45° with respect to the vertical axis of the code field 53 for the encoding of "1's" and "0's," respectively (see FIG. 2). The data byte boundaries are shown in FIG. 3 in dotted line because the purpose of this drawing is to show that certain burst error patterns such as the vertical burst error 51, threaten to corrupt a relatively large number of data bytes.

Various error correcting codes, such as the well known Reed-Solomon symbol oriented codes, can be used to protect the data that is encoded by the glyph code 52. For a Reed-Solomon code, two parity symbols have to be added to the glyph code 52 for each symbol error that it is desired to correct, thereby significantly impacting the length of the code 52. This impact can be reduced if care is not taken to minimize, or at least reduce the number of symbol errors that are likely to occur. For instance, in FIG. 3, the vertical burst error pattern 51 corrupts up to eight different data bytes. Therefore, if the error correction codes are computed on the data bytes, up to sixteen parity symbols would be needed to correct for the glyph decode errors that are caused by the error pattern 51.

A concurrently filed and commonly assigned United States patent application Ser. No. 07/856,002 of David L. Hecht on "Logically Independent Subarray Tilings of Glyph Codes for Reduced Hard Error Susceptibility" (D/92202) points out that the bits that are received for encoding in the glyph code 52 advantageously are logically sorted into a revised order, prior to being encoded, whenever such a re-ordering is required to sort the bits into a set of fixed bit length symbols that correlate with an anticipated burst error pattern. This revised bit ordering does not affect the order of the message bits within the data bytes. Instead, it sorts the bits in a known logical order into a set of fixed bit length symbols that (1) spatially correlate with the anticipated error pattern, and (2) provide a disjoint cover of the message bits (i. e., the symbol set spans the message bits, but no bit is included in more than one of symbols of the set). Thus, the message bits (and, therefore, the data bytes) can be protected by parity symbols from an error correction code that is computed on this error correlated symbol set. In other words, the message data can be protected against decode errors arising from the anticipated error pattern by appending encodings of only a few of these error correlated parity symbols to the encoded message data because any such errors will be bunched into a relatively small number of the protected symbols and/or the parity symbols.

For example, if vertical burst error patterns, such as the error pattern 51, are of particular concern, the parity symbols suitably are computed by an error correction coding of a set of fixed bit length symbols that vertically map into the glyph code 52 in accordance with a tiling pattern of the type shown, in FIG. 4. Preferably, the glyph encodings of the parity symbols are appended to the encoding of the message bits by an extension of the tiling pattern for the error correlated symbol set, so that the parity symbols also are spatially correlated with the anticipated error pattern, Moreover, the symbol size that is used for computing the error correction code preferably is selected to be an integer submultiple of the number of bits that are encoded by the code 52 along both its horizontal axis and its vertical axis, thereby avoiding spatial fragmentation of the symbols.

As will be appreciated, the bits that are to be encoded may be sorted into symbol sets that correlate with other types of burst error patterns. For instance, FIGS. 5 and 6 illustrate tiling patterns for fixed bit length symbols 58, 59 and 60, that correlate with generally rectangular and cross-like burst error patterns, respectively. The square mapping of the symbol 58 is especially noteworthy because it spans the glyph encodings of nine bits, thereby confirming that the bit size of the symbols that are used for computing the error correction code need not necessarily conform to the bit size of the data bytes. For information on still other tiling patterns that might be used, reference is made to B. Grunbaum and G. C. Shepard, *Tilings and Patterns,* Witt. Freeman, 1989.

If only one burst error pattern is of concern, the encodings of the data bytes may be spatially oriented in the code field 53, so that they correlate with the anticipated error pattern. This obviates the need for sorting the bits into a second set of symbols. Indeed, whenever the data byte encodings in a glyph code correlate with an anticipated error pattern, the data encoded in the code can be protected efficiently against any decode errors that might be caused by the anticipated error pattern by including parity bytes in the code from an error correction code that is computed on the data bytes. Such a mapping of the data byte encodings is not, however, a full solution to the problem if it is necessary or desirable to protect the encode data efficiently against decode errors arising from any one or more of a plurality of burst error patterns that are poorly correlated with each other.

Figure 7:
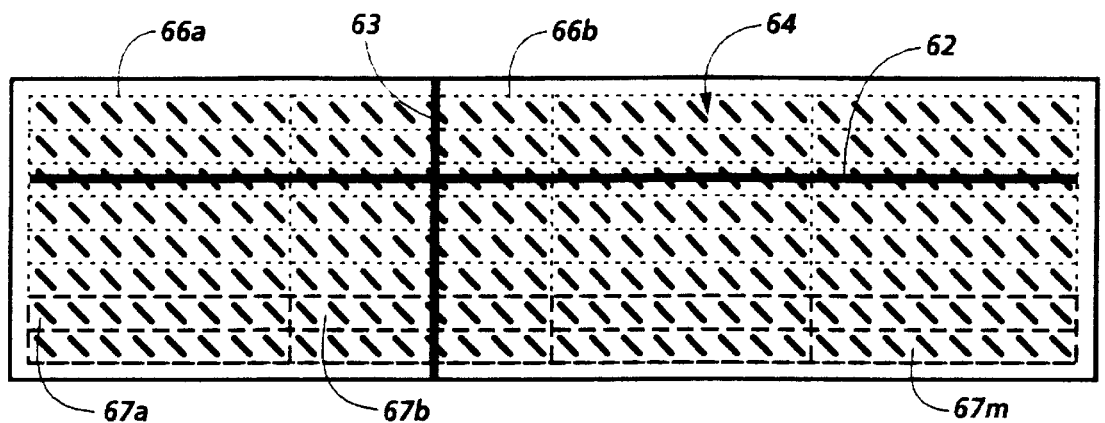
FIG. 7 illustrates a self-clocking glyph code that is degraded by both vertical and horizontal burst error patterns.

In practice, glyph codes frequently are at risk of being degraded significantly (i.e., sufficiently to cause decode errors) by multiple, predefined burst error patterns that are not well correlated with each other. For example, as shown in FIG. 7, both horizontal and vertical burst error patterns 62 and 63, respectively, might threaten to cause errors in the decoding of a glyph code 64. Fortunately, as pointed out in a concurrently filed and commonly assigned United States patent application Ser. No. 07/854,153 of David L. Hecht et al on "Protecting Two Dimensional Codes From Multiple Burst Error Patterns (D/92203), it has been found that an iterative process can be employed for efficiently protecting the glyph encoded data against a plurality of different burst error patterns.

More particularly, for each iteration of this extended error protection process, the message bits that are to be encoded in the glyph code 64 are sorted into fixed bit length symbols that correlate with a respective one of the anticipated error patterns. Furthermore, an error correction coding then is computed on this error pattern correlated symbol set, thereby providing a preselected number of parity symbols for protecting the data encoded in the code against decode errors arising from the given error pattern. The foregoing process is repeated for one after another of the anticipated burst error patterns, so the parity symbols for protecting the data against different ones of the anticipated burst error patterns are computed sequentially during successive iterations of the process.

Figure 8:
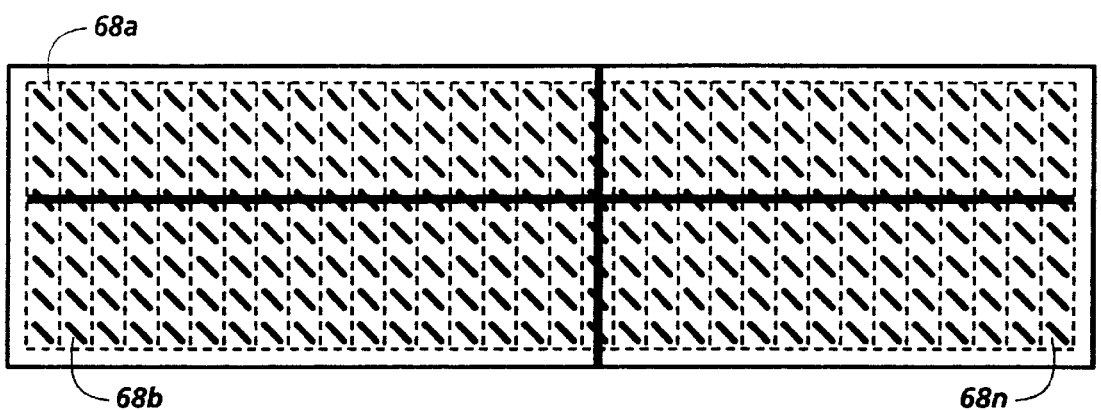
FIG. 8 shows the code of FIG. 7 with the bits that are encoded therein sorted into a symbol set that correlates with vertical burst error patterns.
Figure 9:
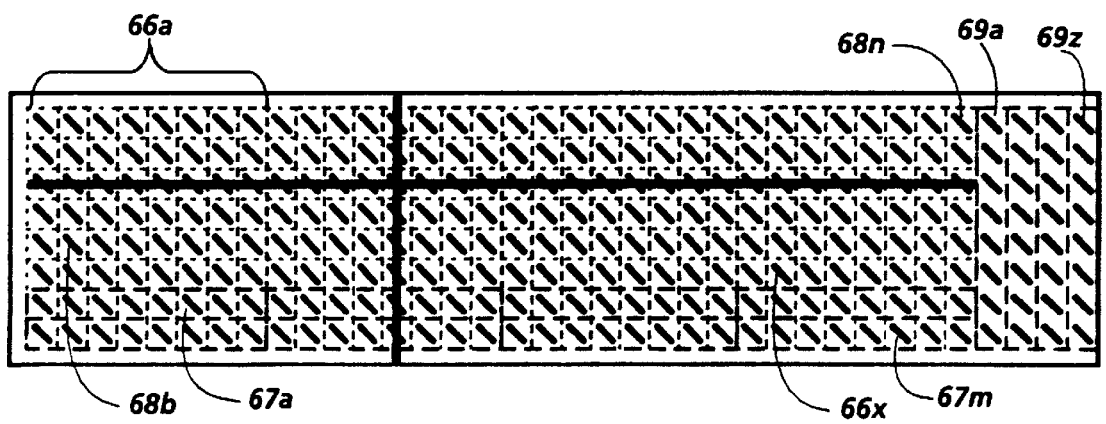
FIG. 9 shows the code of FIG. 8 with vertical parity symbols appended thereto.

If desired, the parity symbols that are generated during subsequent iterations of the above-described process may be provided by error correction codings that are computed on the message bits that are to be encoded in the glyph code, together with the parity symbols from previous iterations of the process. In that event, these subsequently computed parity symbols protect not only the message data, but also the previously computed parity symbols. For instance, as shown in FIG. 7, the horizontal parity symbols for the glyph code 64 are provided by an error correction coding that is computed on the data bytes of the message that is to be encoded in the glyph code 64. This is a natural first step because the data bytes horizontally map into the code 64 in left-to-right, top-to-bottom order (see the dotted line outlines of the data byte encodings 66a–66x). As will be seen, the horizontal parity symbols are appended to the message, such that they also horizontally map into the glyph code 64 by extension of the encoded byte sequence (see the dash line outlines of the horizontal parity symbol encodings 67a–67m). Thereafter, as shown in FIG. 8, the message bits and the bits of the horizontal parity symbols are sorted into a set of fixed bit length symbols that correlate with the vertical burst error pattern (see the dotted line outline of the encodings 68a–68n of this vertically correlated symbol set). This vertically correlated symbol set, in turn, is employed for computing the vertical parity symbols for the code 64. Then, as shown in FIG. 9, the vertical parity symbols are appended to the data that is to be encoded in the glyph code 64, so that the vertical parity symbols map into the code 64 as vertically elongated symbols that extend the code 64 sideways (see the dash line outlines of the vertical parity encodings 69a–69z in FIG. 8).

In accordance with this invention, however, all of the parity symbols may be computed solely on the message bits that are to be encoded in the glyph code 64. This permits the parities for protecting the code against the different potential burst error patterns to be computed independently of each other, thereby minimizing the number of decode errors that require correction. It also causes the result that is obtained to be independent of the order in which he parities are computed, and it facilitates modifying the message size and the type and amount of parity protection that is provided for the message. Typical processes for applying this invention to the writing and reading of a two dimensional self-clocking glyph code of predetermined byte capacity are illustrated in FIGS. 10 and 11 respectively.

Figure 10:
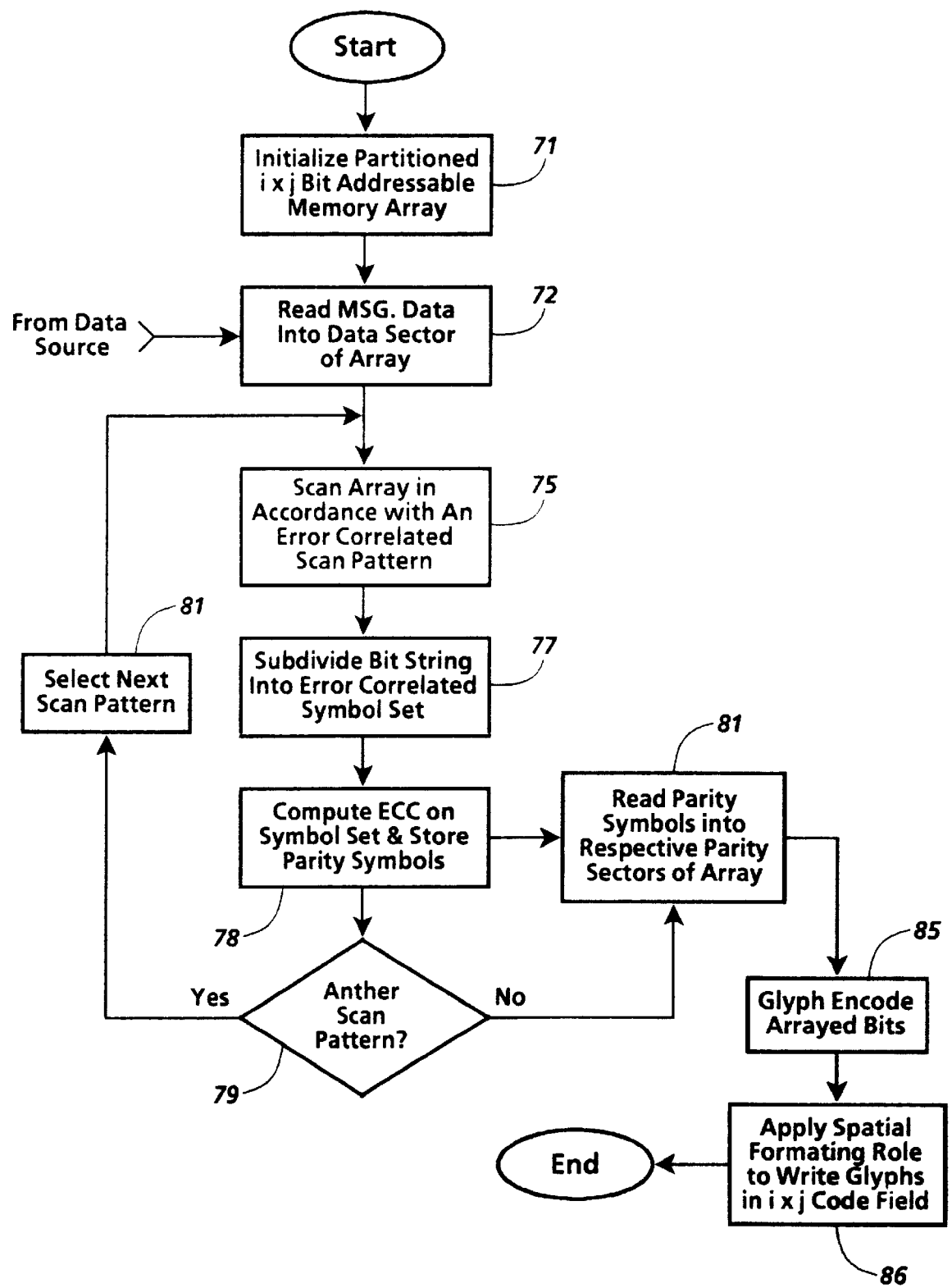
FIG. 10 is a flow chart that illustrates a process for writing a glyph code in accordance with this invention.
Figure 11:
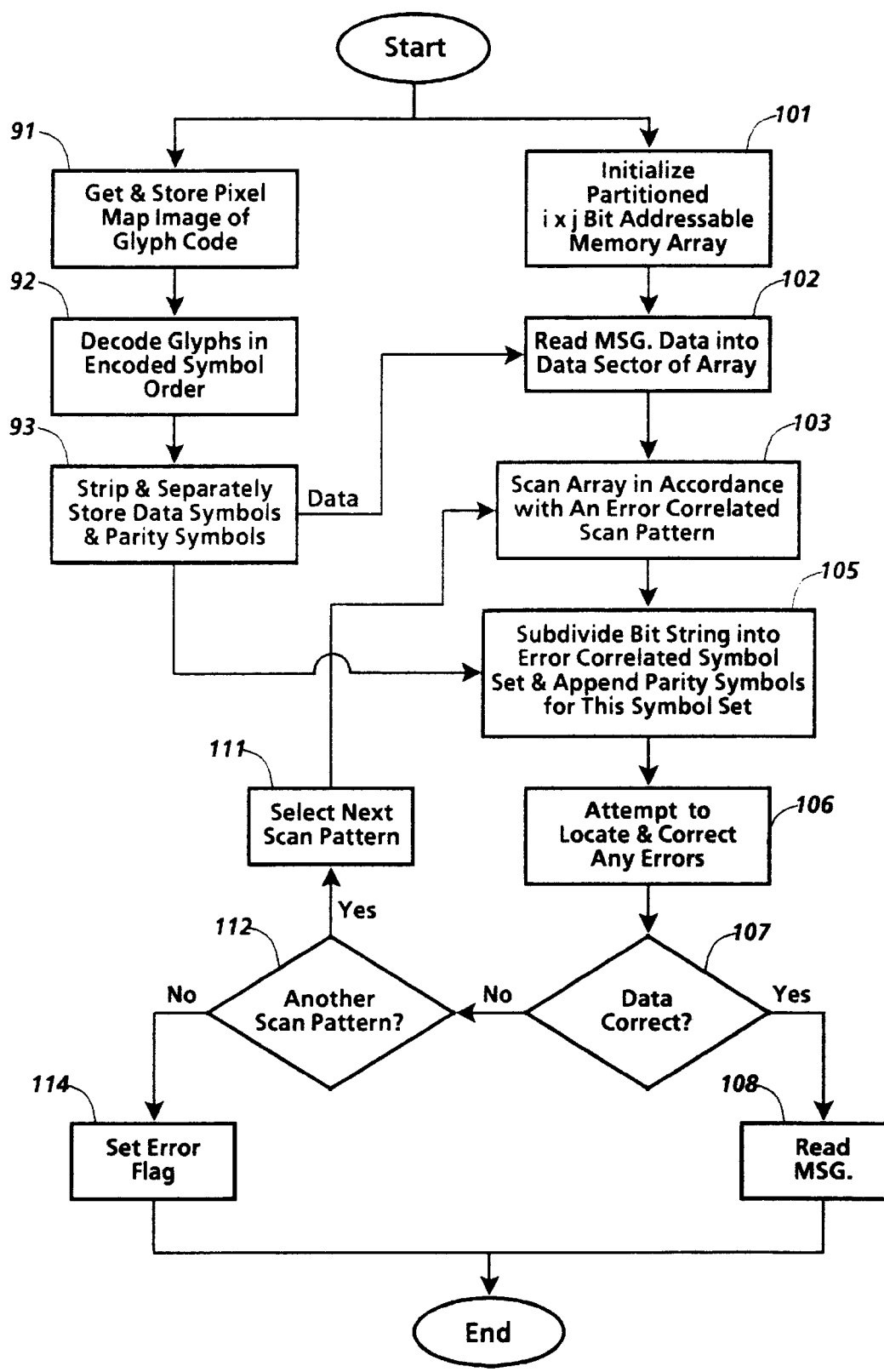
FIG. 11 is a flow chart that illustrates a process for reading a glyph code that is written in accordance with this invention.
Figure 12:
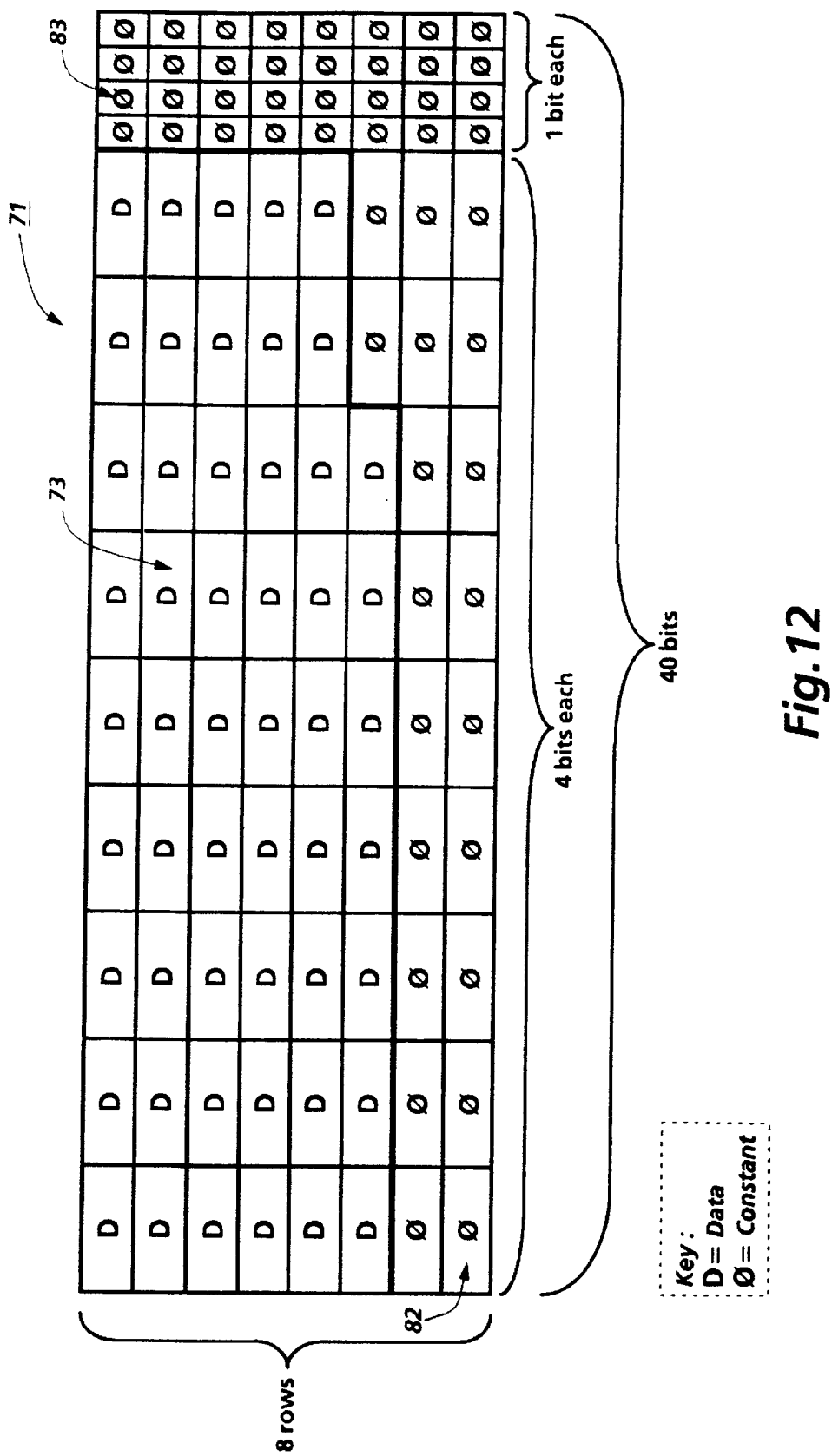
FIG. 12 illustrates a memory array that is prepared for use in computing error correction codings for the write process shown in FIG. 10.
Figure 13:
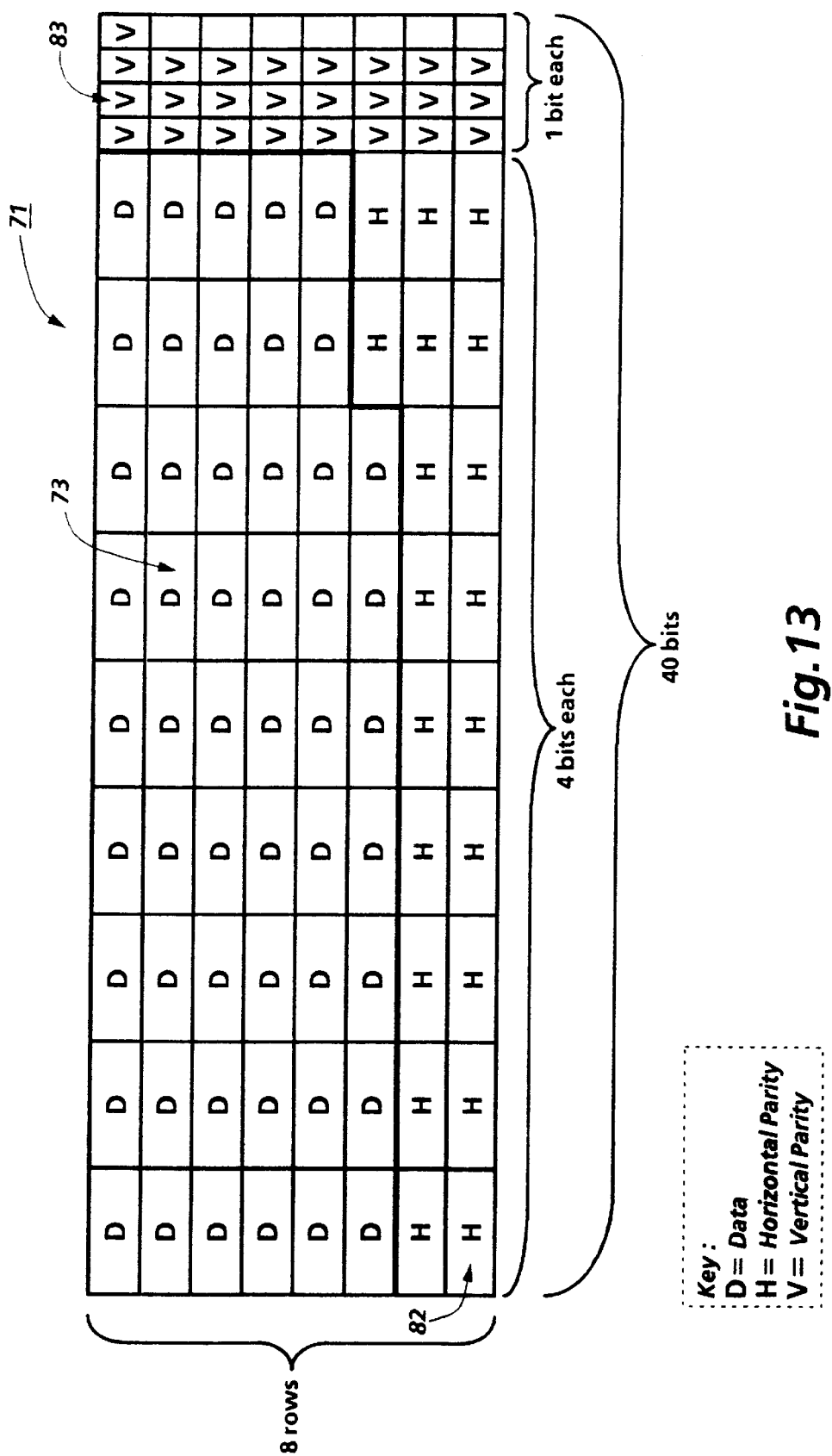
FIG. 13 illustrates the memory array of FIG. 12 after the vertical and horizontal parity symbols have been appended to the data bytes.

Focusing on FIG. 10, it will be seen that a partitioned, i x j, bit addressable memory array 71 is initialized in preparation for writing a glyph code. The partitioning of the array 71 suitably is implemented by programming its i and j address pointers, so that predetermined sectors of the array 71 are reserved for the data bytes and for each of the different sets of parity symbols that are to be encoded by the glyph code. For example, FIGS. 12 and 13 illustrate a partitioning of a forty byte array 71 to accommodate twenty-six data bytes, ten horizontal parity bytes, and four vertical parity bytes (see FIG. 13 in particular). In this case, the data symbols and the parity symbols are each one byte (i.e., eight bits) long, so the array 71 is a 8×40 array (as illustrated, the rows and columns of the array are each 1 bit high and four bits wide, respectively). In other words, the array 71 is an integer multiple of the symbol size along both its horizontal and vertical dimensions, although there is some fragmentation of the data bytes in this particular embodiment. In view of the usual 2:1 overhead factor that is associated with the use of a standard Reed-Solomon code, it will be understood that ten horizontal parity symbols and four vertical parity symbols are sufficient to protect a code that is laid out in accordance with FIG. 13 against the loss of any one column of bits or any two rows of bits, respectively.

In this instance, the parity protections that are provided for dealing with the different anticipated burst error patterns are mutually independent of each other, so errors made during the decoding of any given parity symbol taxes the error correcting capacity of just one of the error correction codings. To achieve this independence, the memory array 71 suitable is initialized by setting all of its bits to the same constant value (i.e., all "1's" or all "0's").

Following the initialization of the memory array 71, the desired number of data bytes (twenty-six in this example) are transferred at 72 into its data sector 73 (FIG. 12) from a data source in a known logical bit order. The memory array 71 then is scanned at 75 in accordance with one after another of a plurality of predetermined scan patterns, each of which is selected to correlate with a respective one of the anticipated burst error patterns. For performing these scans, the i and j address pointers for the memory array 71 are advanced synchronously under program control to read the memory array 71 out bit-by-bit in accordance with the successive scan patterns.

Each scan of the memory array 71 defines a set of symbols, as at 77, that not only provide a disjoint cover of the contents of the memory array 71, but also correlate with a respective one of the anticipated burst error patterns. Thus, an error correction coding is performed on this symbol set to compute the desired number of parity symbols for the burst error pattern with which the given set of symbols is correlated, and these parity symbols then are stored, as at 78. If it is determined at 79 that there is another burst error pattern still to be considered, the process is repeated, as at 81, based on the scan pattern for the next burst error pattern of concern. However, when it is found at 79 that all parities have been computed, the parity symbols that have been accumulated are retrieved from storage, thereby enabling them to be appended to the data bytes, as at 81, by writing them into the sectors 82 and 83 (FIG. 13) of the array 71 that are reserved for them. Subsequently, the contents of the memory array 71 are encoded at 85 bit-by-bit in predetermined order to write a self-clocking glyph code encoding of the contents of the memory array into an i x j glyph code field on a suitable recording medium at 86.

Turning to FIG. 11, it will be seen that the read process complements the write process. More particularly, a pixel map image of the glyph code is read into memory at 91, such as by an input scanner (not shown), and the decode values for the individual glyphs then are determined at 92. The locations of the data bytes and parity symbols in the glyph code are known (see FIG. 13), so that information is used at 93 for separating the decode values for those different symbol sets from each other, thereby enabling the decode values for the respective symbol sets to be stored at independently addressable memory locations.

For correcting correctable decode errors, the memory array initialization, data transfer and scan steps 71, 72 and 75 of the write process are repeated essentially identically at 101, 102 and 103, respectively. Each scan 103 produces a string of symbols that are correlated with a respective one of the anticipated burst error patterns, so the parity symbols for that particular error pattern are appended or otherwise associated with the symbol string at 105 in preparation for correcting errors that might exist. If, the error correction process 106 returns correct data, as determined at 107, the data bytes are read at 108 to reconstruct the encoded message. On the other hand, if it is found at 107 that the decode errors are not susceptible to correction, the process may be repeated, as at 111, using the next scan pattern. If decode errors still exist after all of the scan patterns have been tried, as determined at 112, an error flag suitably is set at 114 prior to terminating the process.

Figure 14:
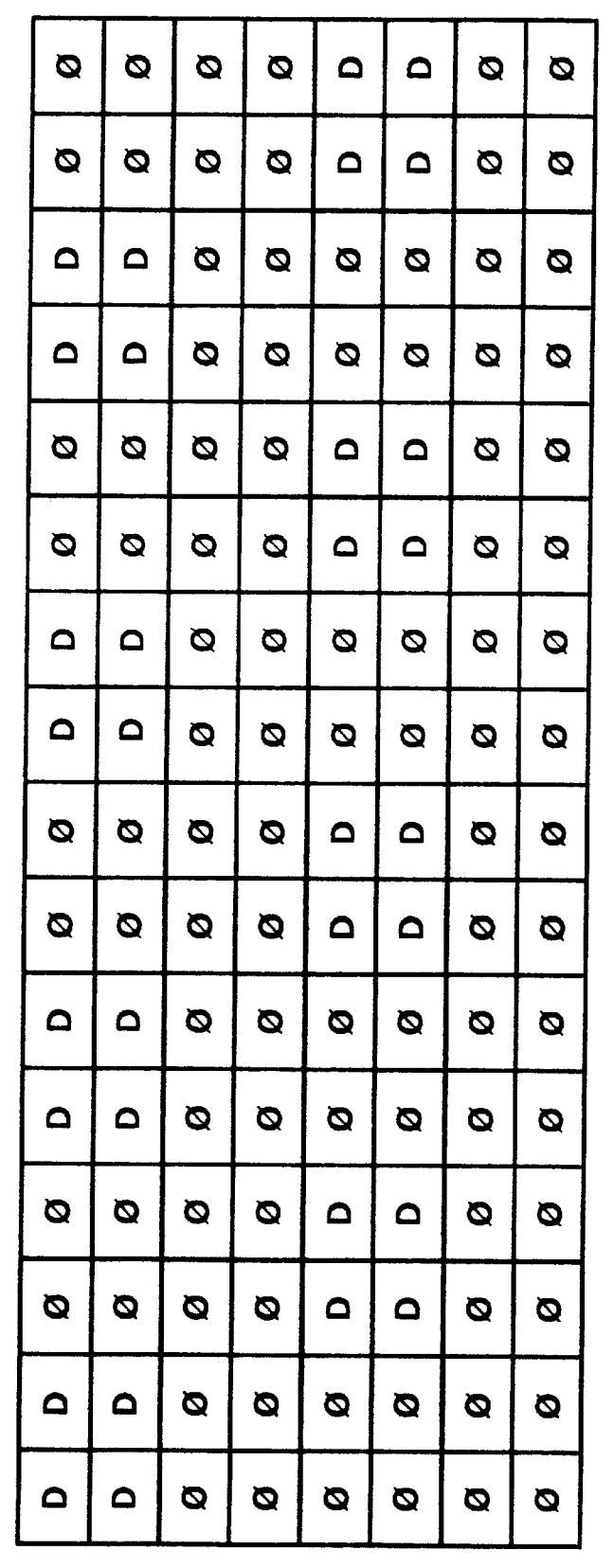

FIG. 14 illustrates a generalization of the glyph code writing and reading processes shown in FIGS. 10 and 11 to indicate that those processes may be employed to independently protect the data encoded in a self-clocking glyph code against any two or more potential burst error patterns. Moreover, it will be evident that the code field (i.e., the glyph encoding of the memory array) can be partitioned more or less as desired to provide contiguous or distributed data sectors and contiguous or distributed parity sectors. More particularly, in this particular embodiment, the data bytes are distributed vertically and horizontally within a 8 bit×48 bit byte aligned array 111 in 2 bit high×1 byte wide data blocks 112. Parity symbols computed on the data blocks 112 of this array are distributively encoded in adjacent horizontal relationship to the data blocks 112 On the other hand, parity symbols computed on the horizontal rows of the array 112 are encoded in rows that are vertically offset from the data blocks 112. Accordingly, if there is a 1:1 mapping between the array 111 and the glyph code encoding of its content (not shown), up to sixteen block correlated parity symbols and up to 16 horizontal parity symbols may be encoded in the glyph code.

However, still further generalizations will suggest themselves. For purposes of these additional generalizations, it's useful to define a "virtual 2$d$ matrix" to be one within which the actual message data is embedded for the purpose of computing a set of parity bytes. For example, the above described memory array 71 is an instance of a virtual 2$d$ matrix that is identical dimensionally to the printed glyph code. This virtual 2$d$ matrix is typically set up to be byte-aligned with respect to the specific scan order used to compute the parity bytes.

With that it mind, the following generalizations are suggested:

1. The virtual 2$d$ matrix within which the message data is embedded for computing parity bytes need have no specific relation to the actual size of the printed glyph pattern. The only constraint is that both the virtual 2$d$ matrix and the actual printed pattern have the message bits in a known relation to each other (typically but not generally in the same position). For providing multiple, mutually independent, error correction protection for the message, bits at locations other than message data should be set to a known constant for both error correction encoding and decoding.
2. The virtual 2$d$ matrix used for computation of parity bytes can be different for each set of parity bytes that are computed.
3. The actual printed pattern can include bits that are neither message data nor parity.
4. The geometry of the printed glyph code may dictate that pad bits be added to the encoded parity bits to force a type of byte alignment that prevents more than one parity byte from being corrupted from a run of errors in a protected mode (such as a vertical run of errors).

Illustrations of the above enumerated generalizations are provided by FIGS. 15–18.

Figure 15:
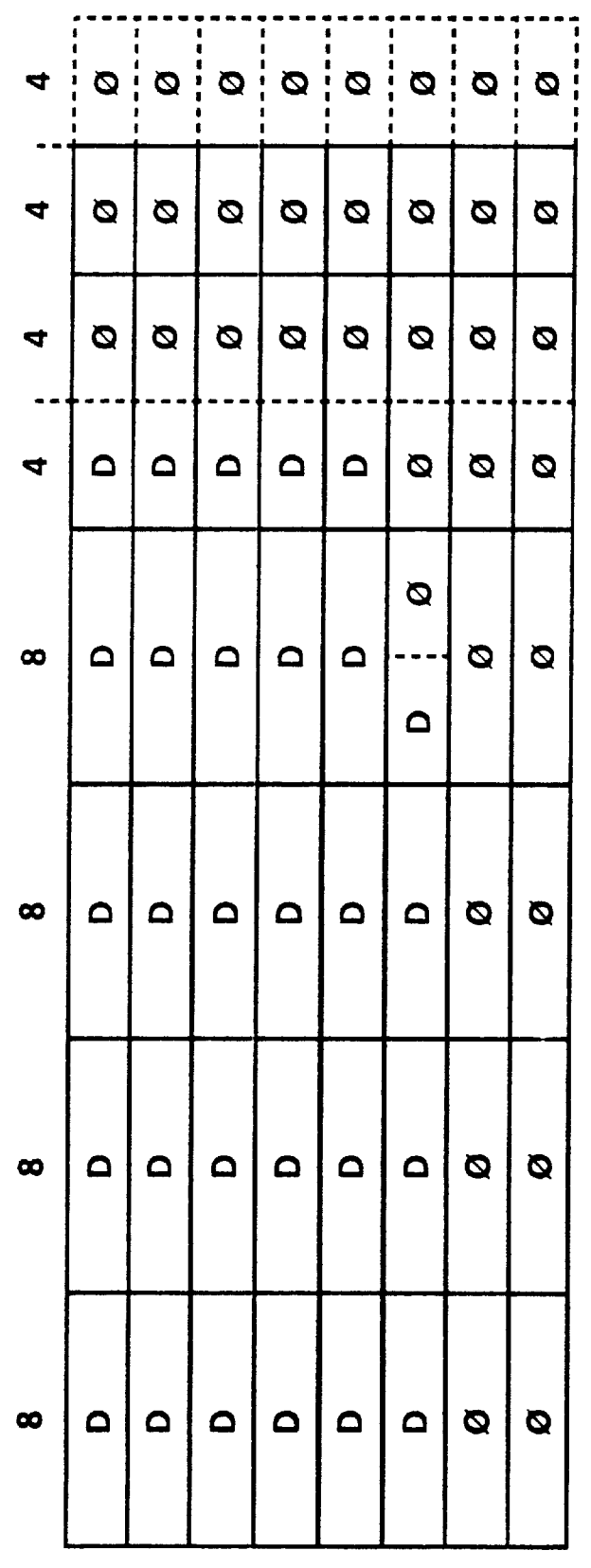
Figure 16:
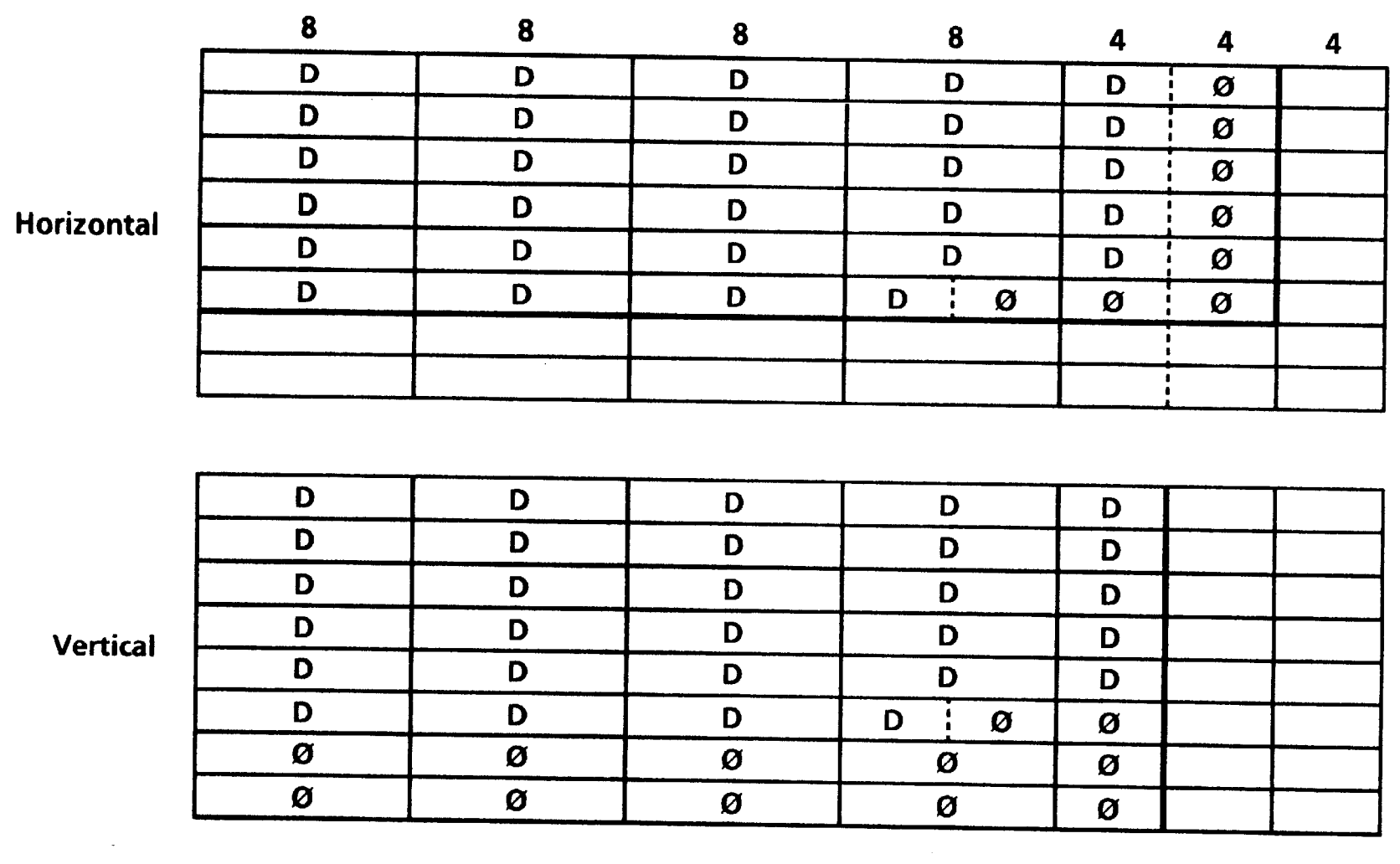

FIG. 15 is based on the premise that it has been found 8 bytes of vertical parity are needed (rather than 4 bytes as previously described), thereby extending the encoding requirement to a total of 44 bytes. Such parity bytes can be computed based on, for example, a virtual 2$d$ matrix of either 40 bytes or 48 bytes. Thus, the virtual 2$d$ matrix 121 can be either a subset of the actual printed glyph pattern, or a superset. Turning to FIG. 16 to further extend this example, it will be assumed that horizontal and vertical parities are to be computed on 44 data bytes through the use of minimum byte-aligned rectangular subregions. Under those circumstances, horizontal parity might suitably be computed using a total of 30 bytes (40 bits×6 bits) of virtual 2d matrix, while vertical parity might be computed using 36 bytes (36 bits×8 bits of virtual 2d matrix). These 30 byte and 36 byte virtual 2d matrices are both subsets of the 40 bit×8 bit glyph code encoding.

Figure 17:
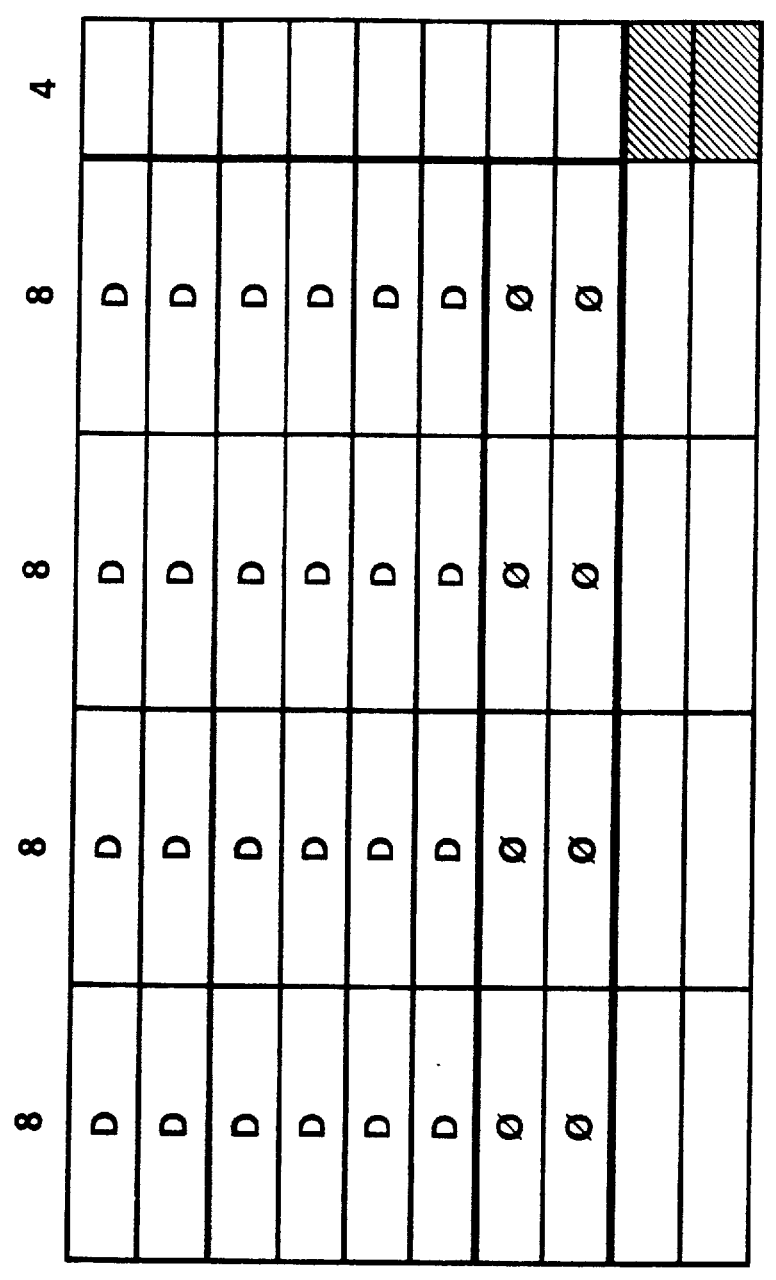

FIG. 17 illustrates a case in which the first three of the above enumerated generalizations all come into play. In this example, there 24 bytes of message data, and the goal is to correct up to either two bad rows or two bad columns. If the data is laid out in a pattern 32 bits wide and 6 bits high, there will four bytes of data in a row. To correct two bad rows (8 bad bytes), 16 bytes of horizontal parity bits typically are required. These 16 bytes can eventually be laid out horizontally in 4 rows below the message data. Further, to correct two bad columns of data, the data suitably is padded with two extra rows for vertical byte alignment. Four bytes of vertical parity can then be computed. These vertical parity bytes, in turn, are eventually be laid out vertically in four columns to the right of the message data, so the final layout for the glyph code pattern is 36 bits×10 bits. Note that:

(a) a virtual 2d matrix of size 32 bits×6 bits was used to compute the 16 bytes of horizontal parity;

(b) a virtual 2d matrix of size was used 32 bits×8 bits to compute the 4 bytes of vertical parity;

(c) horizontal and vertical parity bytes were mapped into the glyph code horizontally and vertically, respectively; and (d) there are 8 elements in a 4 bit×2 bit rectangle in the lower right corner of the glyph code that are neither message data nor parity. Glyphs printed in these positions can be arbitrary.

Figure 18:
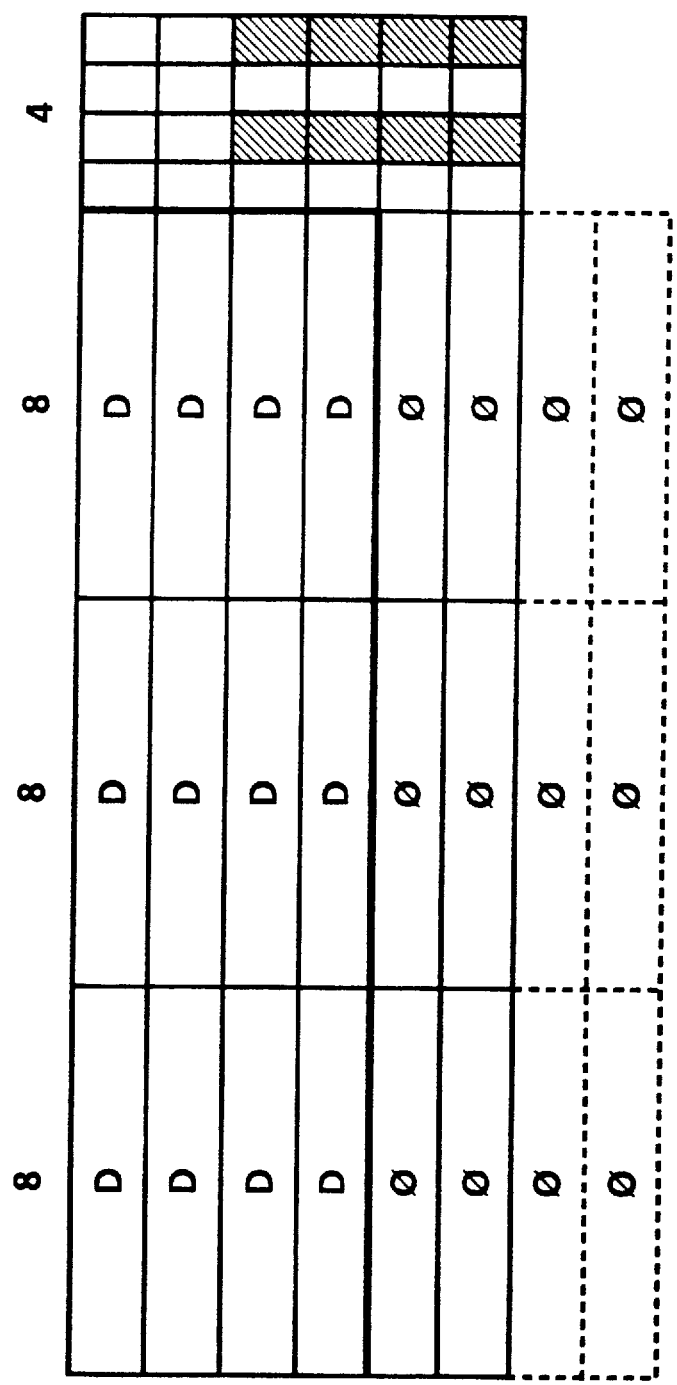

FIG. 18 illustrates a further variation where (a) the virtual 2d matrix used for computation of vertical parity is neither a subset nor a superset of the bit pattern that is encoded in the glyph code; and (b) the vertical parity bits are laid out with padding to force byte alignment.

More particularly, in this case, there are 12 bytes of message data. The goals are to correct up to one bad row or one bad column, lay out the message data in a rectangular block of 24×4 bits, and use a glyph layout pattern of 28×6 bits. To that end, (i) a virtual 2d matrix of size 24 bits×4 bits may be used to compute the 6 bytes of horizontal parity;

(ii) a virtual 2d matrix of size 24 bits×8 bits may be used to compute the 2 bytes of vertical parity;

(iii) to force vertical alignment of vertical parity bytes, pad bits are added, but these bits are arbitrary and are ignored in the decoding process (as indicated by the cross-hatching, there are four of these pad bits in two of the columns). Further, it will be noted that the additional parity bits are accommodated by encoding the two vertical parity bytes in four 6-bit columns on the right hand side of the message data.

The bit pattern that is encoded in the glyph code data is thus 28 bits×6 bits.

What is claimed:

1. In a method for writing and reading a parity protected binary message of predetermined symbol size into and from, respectively, a two dimensional code; the improvement comprising the steps of padding said message with a predetermined set of constant bit values to provide a first array of bits that is symbol aligned for certain scan patterns, where the only variables are message bits;

reading out said first array in accordance with a predetermined one of said scan patterns to provide a first set of symbols that are a disjoint cover of said array;

computing at least one symbol oriented error correction code on said first array of bits to produce parity symbols for protecting said message against an anticipated burst error pattern;

encoding said message and a selected number of said parity symbols in said code;

decoding said code for recovering decode values for said message and for said parity symbols;

separating the decode values for said message from the decode values for said parity symbols;

padding said message with said predetermined set of constant bit values to provide a second symbol aligned array of bits that is identical to said first array, subject only to any decode errors that may have corrupted said message;

reading out said second array in accordance with said predetermined one of said scan patterns to provide a second set of symbols that are identical to first set of symbols, subject only to any decode errors that may have corrupted said message; and computing a decode of said error correction code on said second set of symbols and said parity symbols to correct said decode errors if and when possible.

2. The process of claim 1 wherein the reading and computing steps are iterative in both instances, such that said arrays are assembled into one after another of a plurality of symbol sets for computing said error correction code on one after another of said symbol sets.

3. The process of either one of claims 1 or 2 wherein said symbol oriented error correction code is a Reed-Solomon code.

4. The process of either one of claims 1 or 2 wherein said two dimensional code is written on a hardcopy recording medium.

5. The process of claim 4 wherein said two dimensional code is self-clocking glyph code.

6. The process of claim 5 wherein said symbol oriented error correction code is a Reed-Solomon code.

7. The process of 2 wherein the parity symbols for each of said symbol sets are appended to said data symbols for causing said encoding step to map said parity symbols into said two dimensional code in accordance with tiling patterns that correlate the encodings of said parity symbols with the anticipated error patterns to which they pertain.

8. The process of claim 7 wherein said two dimensional code is written on a hardcopy recording medium.

9. The process of claim 8 wherein said symbol oriented error correction code is a Reed-Solomon code.

10. The process of claim 9 wherein said two dimensional code is self-clocking glyph code.

* * * * *